US011610879B2

(12) United States Patent
Schreiber et al.

(10) Patent No.: US 11,610,879 B2
(45) Date of Patent: Mar. 21, 2023

(54) POWER ON DIE DISCOVERY IN 3D STACKED DIE ARCHITECTURES WITH VARYING NUMBER OF STACKED DIE

(71) Applicant: Advanced Micro Devices, Inc., Santa Clara, CA (US)

(72) Inventors: Russell J. Schreiber, Austin, TX (US); Richard M. Born, Ft. Collins, CO (US); Carl D. Dietz, Columbia City, IN (US); William A. Halliday, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 126 days.

(21) Appl. No.: 16/226,311

(22) Filed: Dec. 19, 2018

(65) Prior Publication Data

US 2020/0203332 A1 Jun. 25, 2020

(51) Int. Cl.
*H01L 27/02* (2006.01)
*H03K 19/00* (2006.01)
*H01L 23/495* (2006.01)
*H01L 25/04* (2014.01)
*G06F 1/26* (2006.01)
*H01L 23/498* (2006.01)

(52) U.S. Cl.
CPC ............ *H01L 27/0207* (2013.01); *G06F 1/26* (2013.01); *H01L 23/49575* (2013.01); *H01L 23/49838* (2013.01); *H01L 25/043* (2013.01); *H03K 19/0008* (2013.01); *H01L 2225/06503* (2013.01)

(58) Field of Classification Search
CPC ..... H01L 27/0207; H01L 23/525–5258; H01L 25/043
See application file for complete search history.

(56) References Cited

U.S. PATENT DOCUMENTS

| 10,509,752 | B2 | 12/2019 | Schreiber et al. | |
| 10,644,826 | B2 | 5/2020 | Wuu et al. | |
| 2003/0141926 | A1* | 7/2003 | Mizuno | H03K 19/0016 327/565 |
| 2013/0010517 | A1* | 1/2013 | Chu | G11C 7/20 365/63 |
| 2015/0009737 | A1* | 1/2015 | Stephens, Jr. | G11C 5/14 365/51 |
| 2015/0070056 | A1* | 3/2015 | Tanadi | H03K 5/14 327/143 |

* cited by examiner

*Primary Examiner* — Matthew C Landau
*Assistant Examiner* — Mark Hatzilambrou
(74) *Attorney, Agent, or Firm* — Zagorin Cave LLP

(57) ABSTRACT

A handshake mechanism allows die discovery in a stacked die architecture that keeps inputs isolated until the handshake is complete. Power good indications are used as handshake signals between the die. A die keeps inputs isolated from above until a power good indication from the die above indicates presence of the die above. The die keeps inputs isolated from below until the die detects power is good and receives a power good indication from the die and the die below. In an implementation drivers and receivers, apart from configuration bus drivers and receivers are disabled until a fuse distribution done signal indicates that repairs have been completed. Drivers are then enabled and after a delay to ensure signals are driven, receivers are deisolated. A top die in the die stack never sees a power good indication from a die above and therefore keeps inputs from above isolated. That allows the height of the die stack to be unknown at power on.

20 Claims, 9 Drawing Sheets

POWER ON DIE DISCOVERY IN 3D STACKED DIE ARCHITECTURES WITH VARYING NUMBER OF STACKED DIE

BACKGROUND

Description of the Related Art

When an input to a CMOS gate is left floating, the gate will float somewhere between VDD and VSS and potentially cause a large short-circuit current between the power and ground rails. In a 3D stacked integrated circuit using a CMOS interface, that is a problem that is exacerbated by varying stack height, which leads to the top die never having its inputs from above being driven. In addition, the height of the die stack is unknown at powerup.

SUMMARY OF EMBODIMENTS OF THE INVENTION

Accordingly, in an embodiment a handshake mechanism allows die discovery in a stacked die architecture that keeps inputs isolated until the handshake is complete.

In one embodiment, a method includes deisolating first inputs to a first die supplied from a second die responsive to, at least in part, a second die power detect signal received from the second die indicating that power is good on the second die.

In an embodiment, the method further includes deisolating second inputs on the second die supplied by the first die responsive to, at least in part, the second die power detect signal die indicating that power is good on the second die.

In an embodiment, the method further includes enabling driving first additional signals from the first die to the second die responsive to a first fuse distribution complete indication on the first die and enabling driving second additional signals from the second die to the first die responsive to a second fuse distribution complete indication on the second die. Third inputs on the first die are deisolated responsive to a delayed version of the first fuse distribution complete indication on the first die, the third inputs for receipt of the second additional input signals received by the first die from the second die. Fourth inputs on the second die are deisolated responsive to a delayed version of the second fuse distribution complete indication on the second die, the fourth inputs for receipt of the first additional input signals received by the second die from the first die.

In an embodiment, isolation of one or more inputs to the second die is maintained responsive to a third die power detect input on the second die failing to indicate that power is good on a third die.

In an embodiment, a first die has first inputs coupled to respective receive circuits. A second die supplies first input signals to the first inputs. The first die is responsive to, at least in part, a second die power detect signal received from the second die indicating that power is good on the second die to deisolate the first inputs by enabling the respective receive circuits.

In an embodiment, the first input signals are for configuration bus signals. In an embodiment the first die is configured to enable driving of first additional signals from the first die to the second die responsive to a first fuse distribution complete indication. The second die is configured to enable driving of second additional signals from the second die to the first die responsive to a second fuse distribution complete indication. The first die is configured to deisolate third inputs responsive to a delayed first fuse distribution complete indication, the third inputs coupled to receive the second additional signals from the second die. The second die is configured to deisolate fourth inputs responsive to a delayed second fuse distribution complete indication, the fourth inputs coupled to receive the first additional signals from the first die.

In another embodiment, an apparatus includes a plurality of stacked die. A bottom die of the stacked die deisolates inputs from a second die above the bottom die responsive to, at least in part, a second die power good indication supplied from the second die to the bottom die. A top die of the stacked die maintains isolation of inputs from above responsive to not receiving a power good indication from above. A second die of the stacked die enables inputs from below responsive to, at least in part, a first die power good indication from the bottom die.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments herein fully discover attached dies via a handshaking distribution of asynchronous signals between die in the stack indicating power is good in conjunction with power sniffers that detect that power is good on a particular die, thereby providing a robust error proof design that discovers the die above and below a particular die in a stacked die environment. That allows inputs to be deisolated once it is known that those inputs will be driven by one of the stacked die. For the top die in the stack, the inputs from above are floating and therefore the inputs from above need to remain isolated. Absent an appropriate alternative to the handshake mechanisms described herein, floating inputs and design errors risk current crow-barring at power on or indefinitely. Current crow-barring refers to unwanted current flowing between VDD and GND.

Figure 1A:
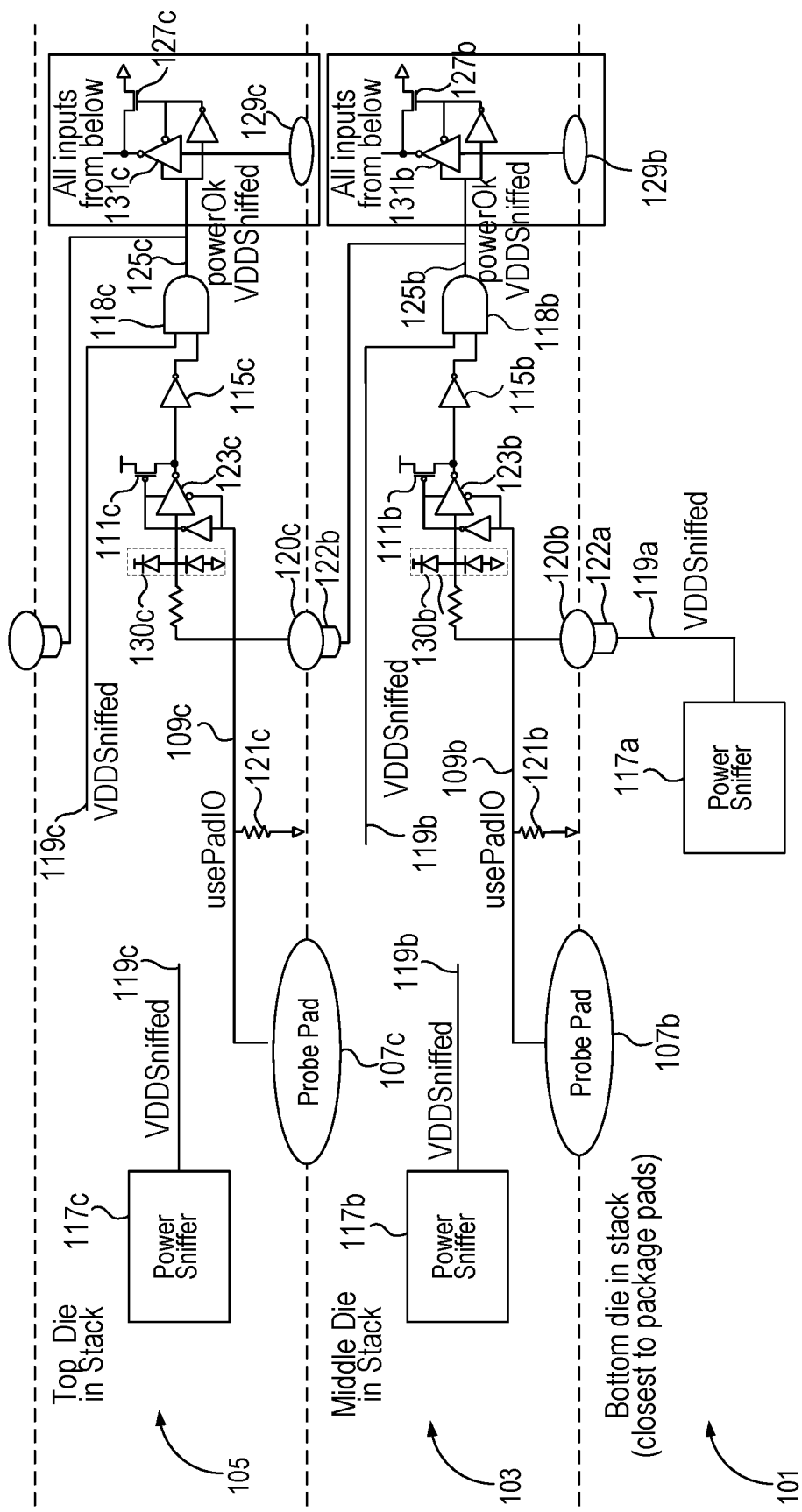
FIG. 1A illustrates a three die stacked system according to an embodiment and in particular aspects of deisolating inputs from below.

FIG. 1A illustrates a three die stacked system according to an embodiment providing a handshaking mechanism. The number of stacked die (three) is by way of example, and additional or fewer die can be stacked and advantageously use the handshake mechanisms described herein. Die 101 is the bottom die in the stack located closest to the package pads. Die 103 is the middle die in the stack and die 105 is the top die in the stack. In embodiments the stacked die include memory chips, processors including central processing units (CPUs) and/or graphics processing units (GPUs), and/or any other type of integrated circuit that can advantageously use a stacked die architecture. For example, the die may include a processor as the bottom die and the middle and top die are memory. Note that the reference numerals in the figures herein use an "a" at the end of the reference numeral to indicate the referenced item is on the bottom die, a "b" to indicate the referenced item is in the middle die, and a "c" to indicate the referenced item is in the top die. If the suffix ("a", "b", "c"), the reference is intended to refer to all the referenced items generically. At probe test, before the die are stacked, a probe pad 107b is driven to VDD. That results in the assertion of the signal usePadIO 109b, which indicates to the die that all the through silicon via (TSV) inputs to the die are floating and causes all TSV input signals to be isolated. The asserted signal usePadIO 109b causes transistor 111b to supply a high voltage level to inverter 115b, which in turn causes AND gate 118b to supply a deasserted powerOkVDDSniffed signal 125b to isolate all inputs from below as explained further herein. The top die 105 operates in the same manner when VDD is applied to probe pad 107c during probe test. Note that at probe test the pads coupled to TSV inputs are too small to probe therefore requiring the TSV pads be isolated.

After the dies have been stacked together, at power up time, power sniffer circuits 117a, 117b, and 117c on respective die layers determine if power has been applied to the die and is at a satisfactory level for CMOS gates to propagate an appropriate ground and VDD ground/power level signals. Note that the power applied to one die is supplied through TSVs to other die. The power sniffer circuits 117a, 117b, 117c supply the VDDSniffed signals 119a, 119b, 119c to indicate whether power is at a satisfactory level. The signals usePadIO 109b and 109c are pulled low through respective resistors 121b and 121c when not over-driven by the probe pads, deisolating the input on each die that passes the VDDSniffed signal from the die below. Thus, e.g., with usePadIO 109b low, the receive circuit 123b (a tristate inverter in the illustrated embodiment) is enabled and transistor 111b is disabled, thereby passing VDDSniffed signal 119a through the TSV 122a on the bottom die 101 to the middle die 103 through landing pad 120b. With power detected on the die layer in question, e.g., VDDSniffed 119b is asserted on die 103 and VDDSniffed 119a is asserted on the die 101 below, AND gate 118b asserts the deisolate signal (powerOkVDDSniffed) 125b, which enables all the receive circuits that receive input signals from the die below (die 101). While the deisolate signal 125b supplies all the receive circuits to control isolation/deisolation of inputs from below, only one receive circuit 131b (a tristate inverter) is shown on the middle die for ease of illustration. The receive circuit 131b receives the input signal from the input shown as landing pad 129b. Note that landing pad 129b is coupled to a TSV in the bottom die 101 and the input signal for landing pad 129b is transmitted through the TSV on the bottom die 101 to the landing pad 129b. Before being deisolated, while the deisolate signal powerOkVDDSniffed 125b is deasserted, transistor 127b pulls the output of the receive circuit 131b to a predetermined voltage, e.g., ground, since transistors 127b is enabled when powerOkVDDSniffed 125b is deasserted.

With usePadIO 109c low, the receive circuit 123c (a tristate inverter in the illustrated embodiment) is enabled and transistor 111c is disabled, thereby passing powerOkVDDSniffed signal 125b through the TSV 122b on the middle die 103 to the top die 105 through landing pad 120c. With power detected on the die layer in question, e.g., VDDSniffed 119c is asserted on die 105 and powerOkVDDSniffed 125b is asserted on the die 103 below, and passed to AND gate 118c through receive circuit 123c and inverter 115c. AND gate 118c asserts the deisolate signal (powerOkVDDSniffed) 125c, which enables all the receive circuits that receive input signals from the die below (die 103). While the deisolate signal 125c supplies all the receive circuits to control isolation/deisolation of inputs from below, only one receive circuit 131c (a tristate inverter) is shown in the top die for ease of illustration. The receive circuit 131c receives the input signal from the input shown as landing pad 129c. Note that landing pad 129c is coupled to a TSV in the middle die 103 and the input signal for landing pad 129 is transmitted through a TSV in the middle die 103. Before being deisolated, while the deisolate signal powerOkVDDSniffed 125c is deasserted, transistor 127c pulls the high impedance output of the receive circuit 131c to a predetermined voltage, e.g., ground, since transistors 127c is enabled when powerOkVDDSniffed 125c is deasserted.

In the illustrated embodiment of FIG. 1A, the VDDSniffed signal 119a is propagated to the middle die and powerOkVDDSniffed 125b is supplied to the top die. The middle die 103 receives VDDSniffed 119a through landing pad 120b and the top die 105 receives powerOkVDDSniffed 125b on landing pad 120c. The bottom die receives power first and all three die have power supplies shorted together through TSVs. In other embodiments, the VDDSniffed signal from each die layer is provided to the die layer above rather than powerOkVDDSniffed 125. For example, in embodiments top die 105 receives the VDDSniffed signal 119b rather than the powerOkVDDSniffed 125b. In other embodiments, VDDSniffed 119a is propagated up through the die stack to each layer. The circuits 130b and 130c represent an electrostatic discharge (ESD) protection circuit on inputs to the die.

Figure 1B:
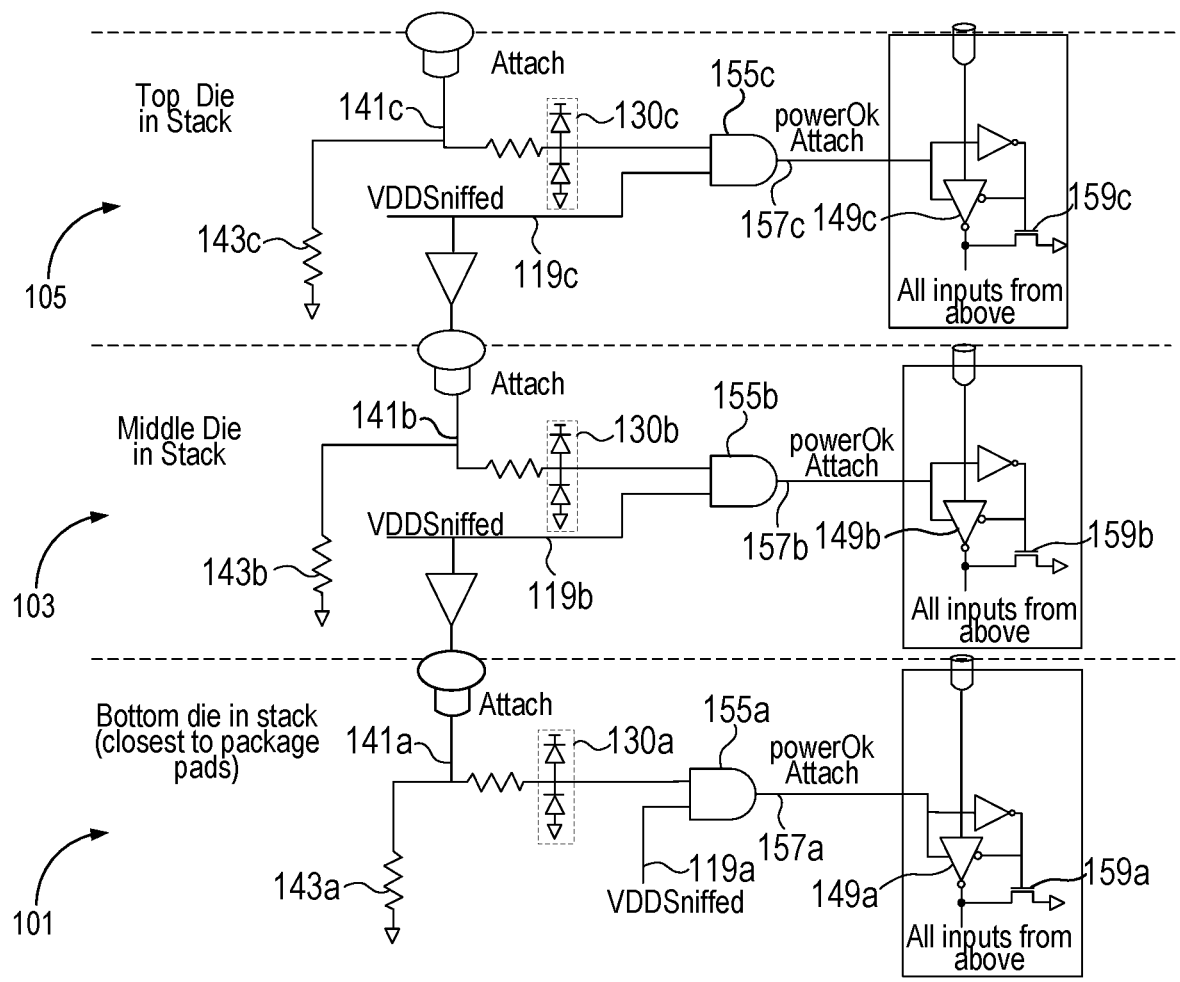
FIG. 1B illustrates additional details of a three die stacked system according to an embodiment and in particular aspects of deisolating inputs from above.

Referring to FIG. 1B, all the die also have respective input signals 141a, 141b, 141c from above called Attach. The Attach signals 141a, 141b, 141c are pulled low through respective resistors 143a, 143b, 143c when nothing is attached above a particular die and driving the Attach signal. When die 105 sniffs the power on its die stack layer, the die drives down an asserted VDDSniffed 119c to the input Attach 141b on the die layer below. When die 103 sniffs the power on its die stack layer, the die drives down an asserted VDDSniffed 119b to the input Attach 141a on the die layer 101. Note the bottom die 101 does not supply an Attach signal as there is no die below it. Once Attach 141b and VDDSniffed 119b are asserted, AND gate 155b supplies another deisolate signal 157b (powerOkAttach) that deisolates all the die inputs from above by enabling the receive circuits, shown by example as receive circuit 149b and turning off transistor 159b. Once Attach 141a and VDDSniffed 119a are asserted, AND gate 155a supplies another deisolate signal 157a (powerOkAttach) that deisolates all the die inputs from above by enabling the receive circuits, shown by example as receive circuit 149a and turning off transistor 159a. With Attach 141c pulled low since there is no die above the top die, the deisolate signal 157c (powerOkAttach) being low isolates the input by causing the output of AND gate 155c to be low, which turns off receive circuit 149c and turns on transistor 159c, which sets the output of the receive circuit 149c to a predetermined voltage. In the embodiment illustrated, transistor 159c, when enabled, couples the output node of the receive circuit to ground. In that way, for the top die 105, the isolation ensures that no circuits that are coupled to the output of the receive circuit 149, have floating inputs.

Figure 1D:
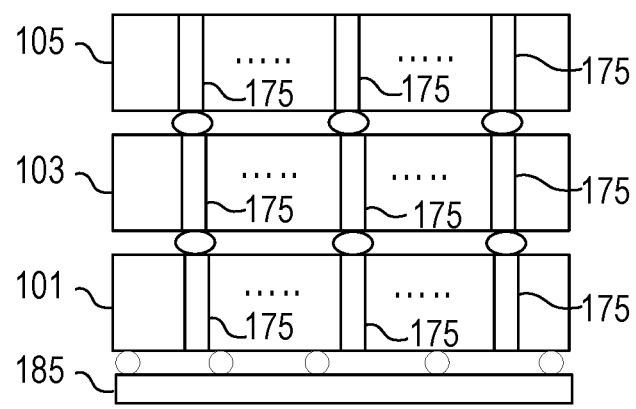
FIG. 1D illustrates a high level block diagram of a three die stack with TSVs.
Figure 1C:
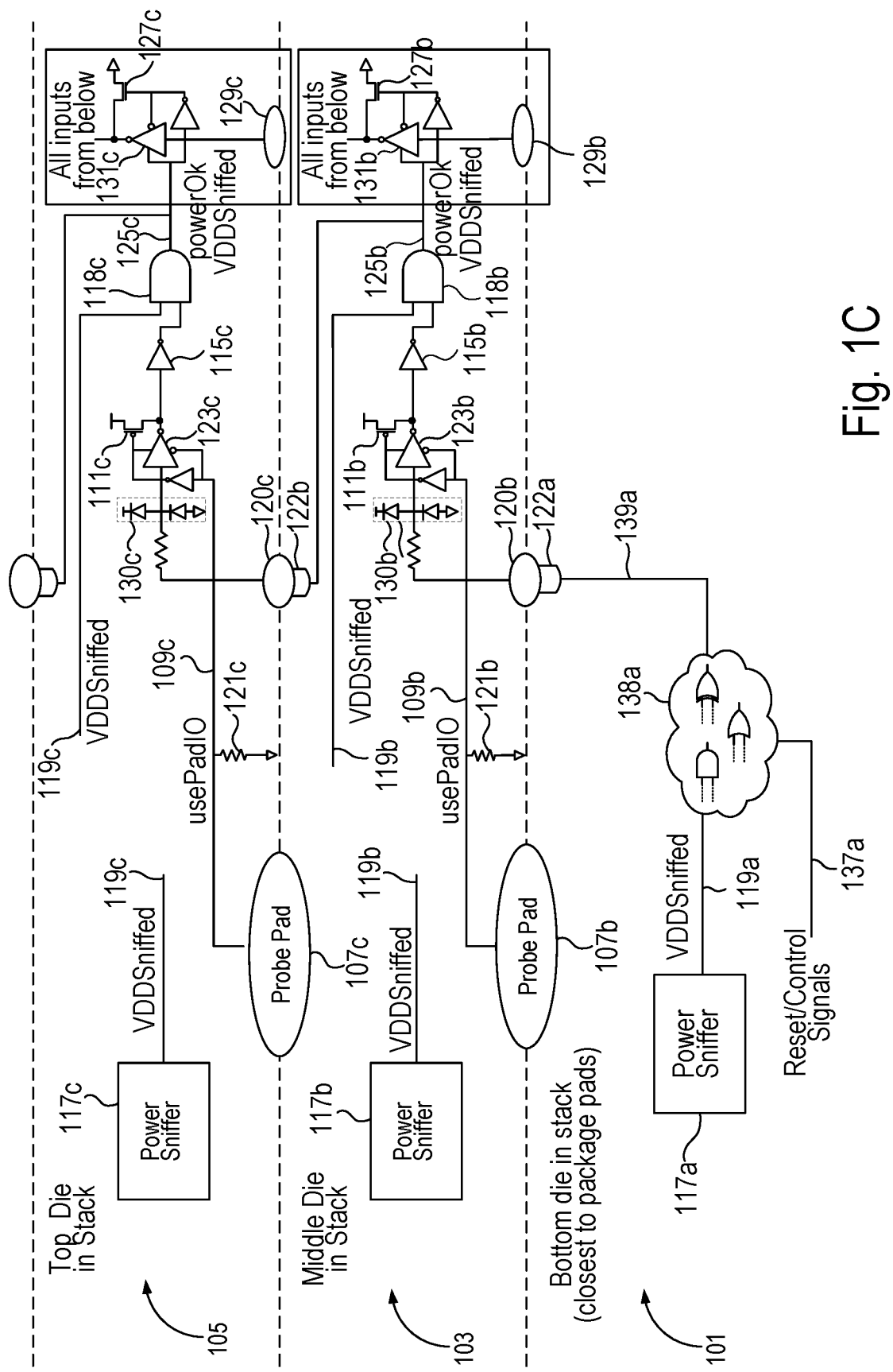
FIG. 1C illustrates an embodiment in which the VDDSniffed signal on the bottom die is logically combined with one or more reset control signals.

FIG. 1C illustrates an embodiment in which the VDDSniffed signal 119a on the bottom die is logically combined in logic cloud 138a with one or more reset/control signals 137a. The output 139a of the logical combination is supplied to the middle die 103 to indicate that all preconditions (e.g., power good, reset, and any other required qualifications) on the first die have been met for the second die to deisolate signals from below. The particular logical combination depends on the number and type of reset/control signals that are combined for a particular implementation. In the simplest case, no reset/control signals are utilized as shown in FIG. 1A.

FIG. 1D illustrates a high level block diagram of a three die stack with TSVs 175. The bottom die 101 is coupled to the circuit board 185. The TSVs may be used to distribute power, ground, data, control, and other signals through the die stack. Note that in stacked die embodiments, there is a higher density of signals between the stacked die through TSVs 175 than from the bottom die to the circuit board 185.

Figure 2:
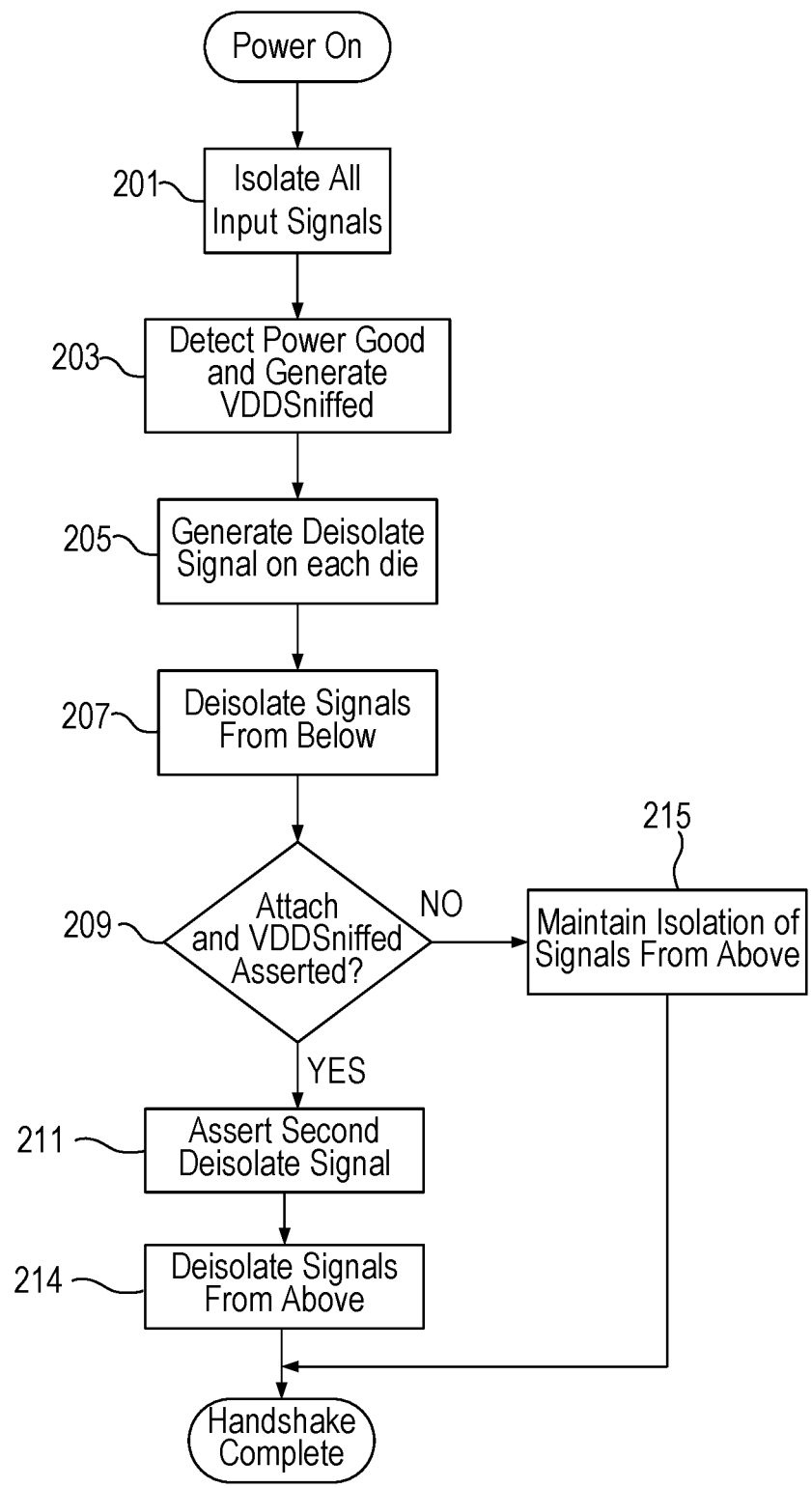
FIG. 2 illustrates a flow diagram of operation of the embodiment illustrated in FIGS. 1A and 1B.

FIG. 2 shows a flow chart illustrating the handshake that occurs in the stacked die embodiment illustrated in FIGS. 1A and 1B. Right after power on occurs, all input signals are configured to be isolated in 201. At 203, each die detects if power is good and asserts a VDDSniffed signal indicating that power is good. With usePadIO 109 pulled to ground, VDDSniffed is provided from the die below and combined with VDDSniffed on the particular die to assert a first deisolate signal (powerOkVDDSniffed) in 205. With the first deisolate signal asserted, the die (except for the bottom die) deisolate all signals from below in 207. Note that on the bottom die 101 in the embodiment illustrated in FIG. 1A, no signals are provided from below and the handshake and circuits to enable signals from below are not needed. Each die also evaluates the Attach signal in 209. If Attach and VDDSniffed are both asserted, the die asserts the second deisolate signal (powerOkAttach) in 211 and deisolates input signals from above in 214. However, if Attach is not asserted and remains at ground, the isolation of signals from above is maintained in 215. In that way, the die stack can be of arbitrary height and the top die still maintains the isolation of the inputs from above. The embodiments illustrated by FIGS. 1A, 1B, and 2 form a fully hand-shook design that is guaranteed to not deisolate any input until the input has proven to be driven, removing any chance of short circuit current due to floating inputs driving non-isolated inputs.

Though the embodiment shown in FIGS. 1A and 1B can be used to guarantee the proper isolation of 3D stacked chips TSV inputs, the embodiment relies on always driven TSV outputs. That is, while inputs are isolated until the handshaking allows the inputs to be deisolated, the outputs are always driven. That can be a problem in the case that there is a shorted TSV that needs to be repaired since powering on the die stack with a shorted TSV could cause very high current until fuse distribution isolates the bad TSV(s) and uses redundant TSV(s) in their place. Most repair done on circuits on a chip (like static random access memory (SRAM)) requires either a built in self test (BIST) run and/or a fuse read to determine how to make the repair. That runs the risk of having high current at initial power on due to a TSV short and for thousands of cycles after until the fuse distribution exploits built-in TSV redundancy to make the repair.

However, by allowing just a few configuration bus signals to always be driven, the stacked die can be configured over the configuration bus to isolate bad TSVs prior to deisolating all other signals. Embodiments utilize the IEEE 1149.1 (JTAG), IEEE 1500, and/or the Serial Configuration Bus (SCB) as the bus over which the stacked die are configured. In an embodiment the configuration bus is a serial bus with 4 ports+1 optional port: data in, data out, clock, a control bit, and a reset bit. Other bus implementations utilize a different serial bus with different signal lines. In an embodiment JTAG may be utilized during a manufacturing test mode and the SCB or another serial bus during functional operations. In an embodiment, since the main serial bus host controller resides on the bottom die, each die above has 3-4 inputs from below and one output to below. Additionally, each die above also needs 3-4 outputs to above and 1 input from above. The specific number of inputs from above and below and outputs to above and to below to perform the configuration depend on the particular implementation of the serial bus used to configure the die. Having the serial bus allows sending fuse/repair data up to the stacked die to program out shorted TSVs.

The initial fuse values in the die dictate no repair. At assembly, the proper repair information is fused into the part. In an embodiment, the fuse information for the die stack after assembly is stored on the bottom die. After assembly, the fuse distribution occurs every time the part is powered on since although the fuses retain their value, in embodiments the TSV input/output circuits do not have any persistent memory. In an embodiment, the systems management unit (SMU) in the bottom die controls the distribution of the fuse information stored in the bottom die to the die stack using the SCB. While the fuse/repair operation is being performed after power up, other non-configuration bus drivers are kept off and other non-configuration bus inputs remain isolated. Turning off the non-configuration bus drivers reduces the chances that shorted TSVs adversely affect the stacked die. Once fuse distribution is complete and shorted outputs dealt with appropriately, the non-configuration bus drivers are enabled (except the ones repaired away) and a short time later all non-configuration bus driven inputs are deisolated. That ensures not deisolating any input that is floating or driving any output that is shorted except for the very few configuration bus signals that must always drive to accomplish fuse repair in the die stack.

Figure 3A:
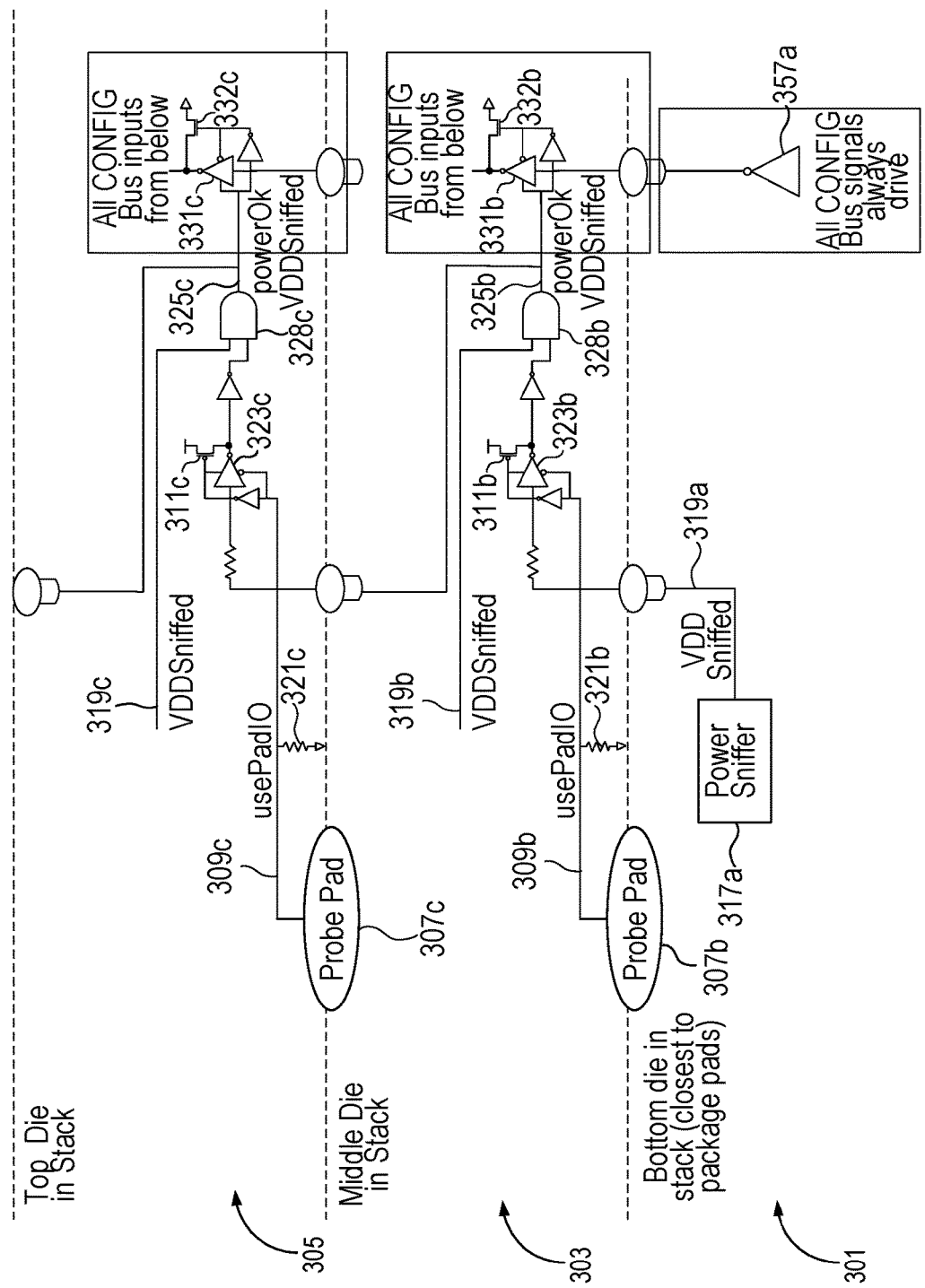
FIG. 3A illustrates another embodiment of a three die stacked system and in particular aspects of deisolating configuration bus inputs from below.

Referring to FIG. 3A, at power on the configuration bus inputs are isolated using the same mechanism as shown in FIG. 1A. The power sniffer 317a on the bottom die 301 determines when the power on die 301 is satisfactory and supplies the VDDSniffed signal 319a to the middle die in the stack 303. Note that the configuration bus outputs are always driven after power on by the bottom die using driver 357a, which is representative of the drivers needed to drive the configuration bus outputs. Probe pad 307b isolates the inputs on the middle die 303 when VDD is applied by a probe during probe test by turning off receive circuit 323b and turning on transistor 311b to pull the output of the receive circuit 323b to a predetermined voltage VDD. Otherwise, usePadIO 309b is pulled to ground through resistor 321b. UsePadIO 309b being deasserted enables the receive circuit 323b to pass the VDDSniffed signal 319a from the bottom die. With the VDDSniffed signal 319b asserted and the VDDSniffed signal 319a asserted, AND gate 328b in the middle die asserts powerOkVDDSniffed 325b and enables all configuration bus inputs from below by turning on the receive circuits, one of which is represented by circuit 331b. In the illustrated embodiment receive circuit 331b is a tristate inverter. When isolated, receive circuit 331b is powered off and transistor 332b pulls the output of receive circuit 331b to ground. In other embodiments, transistor 332b pulls the output of the receive circuit 331b to VDD.

Probe pad 307c isolates the TSV inputs on the top die 305 when VDD is applied by a probe during probe test by turning off receive circuit 323c and turning on transistor 311c to pull the output of the receive circuit 323c to a predetermined voltage VDD. Otherwise, usePadIO 309c is pulled to ground through resistor 321c. UsePadIO 309c being deasserted enables the receive circuit 323c to pass the powerOkVDDSniffed 325b from the middle die 303. With the VDDSniffed signal 319c asserted and powerOkVDDSniffed 325b asserted, AND gate 328c in the top die asserts powerOkVDDSniffed 325c and enables all configuration bus inputs from below by turning on configuration bus receive circuits, one of which is represented by receive circuit 331c. In the illustrated embodiment receive circuit 331c is a tristate inverter. When isolated, receive circuit 331c is powered off and transistor 332c pulls the output of receive circuit 331b to ground. In other embodiments, transistor 332c pulls the output of the receive circuit to VDD. Note that ESD protection circuits on the inputs are not shown in FIGS. 3A and 3B for ease of illustration.

Figure 3B:
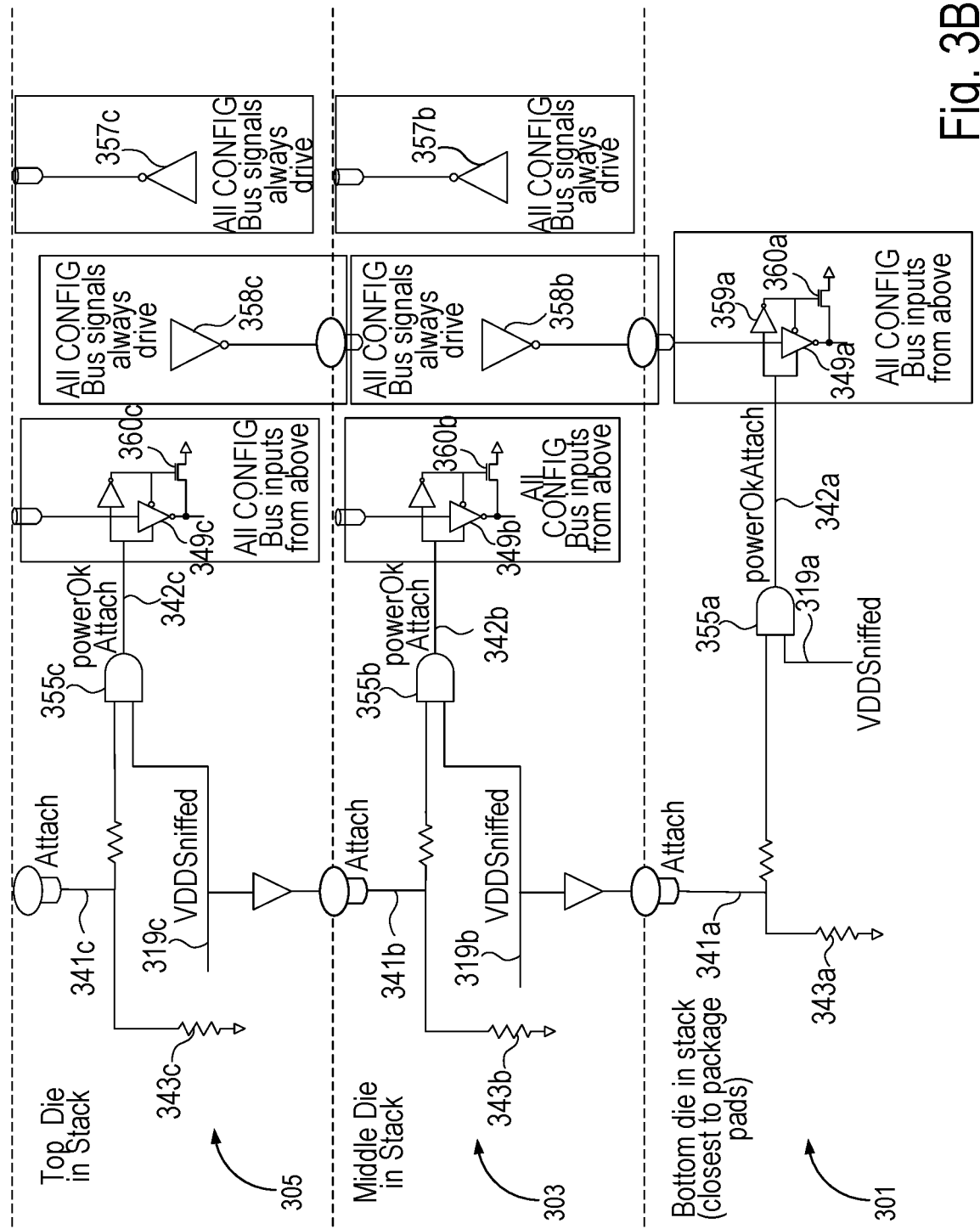
FIG. 3B illustrates additional details of another embodiment of a three die stacked system and in particular aspects of deisolating configuration bus inputs from above and always driving configuration bus signals.
Figure 3C:
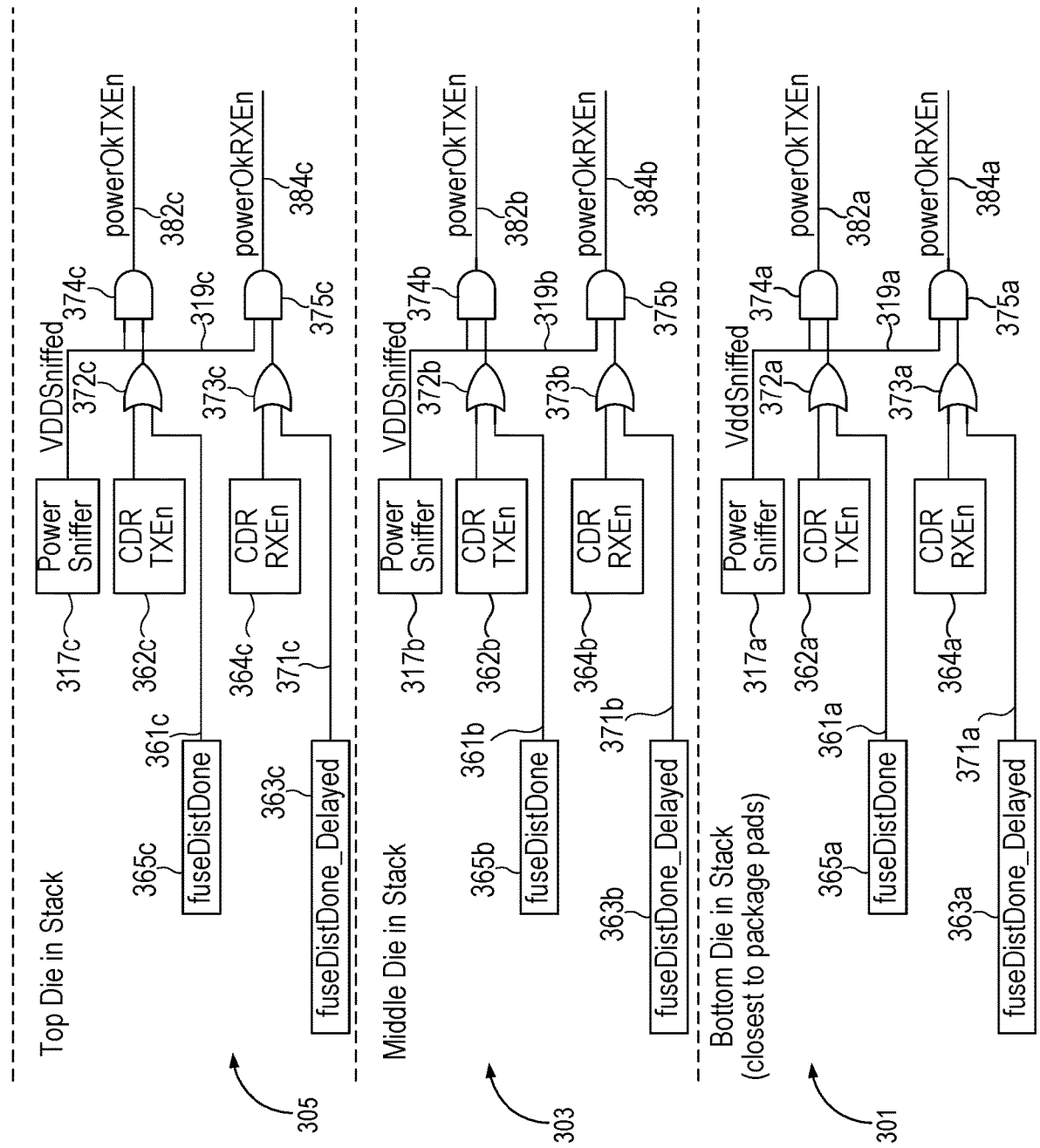
FIG. 3C illustrates additional details of another embodiment of a three die stacked system and in particular certain aspects of waiting for fuse distribution to complete before driving and deisolating non-configuration bus signals.

Referring to FIG. 3B, the bottom die 301 deisolates configuration bus inputs from above once the Attach signal 341a sourced from the middle die is asserted. Attach 341a is VDDSniffed 319b on the middle die 303. Attach 341a overcomes the pull-down resistor 343a. Once VDDSniffed 319a is asserted and Attach 341a is asserted, AND gate 355a asserts powerOkAttach 342a, and the bottom die 301 deisolates configuration bus signals from above by deisolating configuration bus receive circuits, one of which is shown as receive circuit 349a. The deisolation is accomplished by powerOkAttach 342a turning on receive circuit 349a and the inversion of powerOkAttach 342a turning off transistor 360a.

Similarly, the middle die 303 deisolates configuration bus inputs from above once the Attach signal 341b sourced from the top die is asserted. Attach 341b is VDDSniffed 319c on the top die 305. Attach 341b overcomes the resistive pull-down resistor 3413b. Once VDDSniffed 319b is asserted and Attach 341b is asserted, AND gate 355b asserts powerOkAttach 342b, and the middle die 303 deisolates configuration bus signals from top die 305 by turning on configuration bus receive circuits, one of which is shown as circuit 349b. The inversion of powerOkAttach 342b turns off transistor 360b. In isolation, transistor 360b pulls the output node of the receive circuit 349b to ground to ensure internal signals coupled to TSV input nodes are not left floating.

The top die 305 never deisolates configuration bus signals from above because Attach 341c is pulled to ground through resistor 343c causing the output of AND gate 355c to keep powerOkAttach 342c deasserted. The deasserted powerOkAttach signal 342c turns off receive circuit 349c and the inversion of powerOkAttach 342c turns on transistor 360c to pull the output node of receive circuit 349c to ground. In at least some implementations, the Attach signals are used to determine the number of attached die prior to fuse distribution.

Note that in the embodiment illustrated in FIG. 3B, the top die drives all configuration bus signals through driver circuits 357c and 358c, which are representative of the driver circuits on the top die driving configuration bus signals. Similarly, the middle die 303 always drives configuration bus signals through driver circuits 357b and 358b, which are representative of the driver circuits on the middle die driving configuration bus signals, to the die above and below. The bottom die 301 drives all configuration bus signals to the middle die through driver circuits, one which is shown as driver circuit 357a (see FIG. 3A). Note that for ease of illustration the signals driven by the middle and top die do not always line up with receive circuits on the adjacent die.

One advantage of the embodiment illustrated in FIGS. 3A-3D is that drivers remain off (except for configuration bus signals) until fuse distribution and necessary repairs completed, after which the deisolation process starts. After power on, referring to FIG. 3C, each die detects its own power in power sniffer circuits 317a, 317b, and 317c. Note that power sniffer 317a is also shown in FIG. 3A.

In an embodiment, the top die 305 utilizes a fuse distribution done signal (fuseDistDone) configuration bit 365c. In an embodiment a system management unit (SMU) in the bottom die writes the fuseDistDone configuration bit 365c over a configuration bus such as SCB to indicate that fuse distribution is complete. Note that any component that drives the sequencing of power on and reset can supply the fuse distribution done signal. The configuration bit 365c supplies the fuseDistDone signal 361c to AND gate 374c through OR gate 372c. The AND gate 374c also receives the VDDSniffed signal 319c indicating that power is good on the top die. The AND gate 374c supplies the signal powerOkTXEn 382c, which indicates, when asserted that power is good on the die, fuse distribution has been completed, and it is ok to enable transmitting the non-configuration bus signals on the top die. The SMU also writes the fuseDistDone Delayed configuration bit 363c over the configuration bus after a delay after the configuration bit fuseDistDone 365c has been written. The delay is long enough to ensure that the powerOkTXEn signal 382c has been distributed through the die and all input signals are being driven by other die before inputs are deisolated. The AND gate 375c receives a delayed version of the fuse distribution signal 371c (fuseDistDone_Delayed) through the OR gate 373c. The AND gate 375c generates powerOkRXEn 384c that indicates, when asserted, that it is ok to deisolate input signals since all inputs are being driven except in the case where redundancy has been used to program a particular set of TSVs out and they remain floating and isolated. For initial testing (prior to having a fuse recipe with TSV repair enabled), the outputs of configuration data registers (CDRs) 362c and 364c are respectively supplied to OR gates 372c and 373c. The CDRs 362c and 364c are accessible through the configuration bus and are utilized to force the outputs to drive and inputs to receive to find faults and determine a proper fusing recipe.

In an embodiment the SMU in the bottom die writes the fuseDistDone configuration bit 365b over the configuration bus to indicate that fuse distribution is complete. The configuration bit 365b supplies the fuseDistDone signal 361b to AND gate 374b through OR gate 372b. The AND gate 374b also receives the VDDSniffed signal 319b indicating that power is good on the middle die. The AND gate 374b supplies the signal powerOkTXEn 382c, which indicates, when asserted that power is good on the die, fuse distribution has been completed, and it is ok to enable transmitting the non-configuration bus signals on the middle die. The SMU also writes the fuseDistDone_Delayed configuration bit 363b over the SCB after a delay after the configuration bit fuseDistDone 365c is written. The delay is long enough to ensure that the powerOkTXEn signal 382b has been distributed through the die and all input signals are being driven by other die before inputs are deisolated. The AND gate 375b receives the delayed version of the fuse distribution signal (fuseDistDone_Delayed) 371b through the OR gate 373b. The AND gate 375b generates powerOkRXEn 384b that indicates, when asserted, that it is ok to deisolate input signals since all inputs are being driven. For initial testing (prior to having a fuse recipe with TSV repair enabled), the outputs of configuration data registers (CDRs) 362b and 364b are respectively supplied to OR gates 372b and 373b. The CDRs 362b and 364b are accessible through the configuration bus and are utilized to force the outputs to drive and inputs to receive to find faults and determine a proper fusing recipe.

The bottom die 301 utilizes a fuse distribution configuration bit 365a (fuseDistDone) that supplies fuseDistDone signal 361a indicating that fuse distribution has been completed. In an embodiment the SMU writes the fuse distribution configuration bit 365a. The AND gate 374a receives fuseDistDone 361a through OR gate 372a. The AND gate 374a also receives the VDDSniffed signal 319a indicating that power is good on the bottom die. The AND gate 374a supplies the signal powerOkTXEn 382a, which indicates, when asserted that power is good on the die, fuse distribution has been completed, and it is ok to enable transmitting the non-configuration bus signals on the bottom die. The AND gate 375a receives a delayed version of the fuse distribution signal 371a (fuseDistDone_Delayed) through the OR gate 373a. The SMU also writes the fuseDistDone_Delayed configuration bit 363a over the SCB after a delay after the configuration bit fuseDistDone 365a is written. The delay is long enough to ensure that the powerOkTXEn signal 382a has been distributed through the die and all input signals are being driven by the die above before inputs are deisolated. The AND gate 375a generates powerOkRXEn 384a that indicates, when asserted, that it is ok to deisolate input signals since all inputs are being driven. For initial testing (prior to having a fuse recipe with TSV repair enabled), the outputs of configuration data registers (CDRs) 362a and 364a are respectively supplied to OR gates 372a and 373a. The CDRs 362a and 364a are accessible through the configuration bus or test bus and are utilized to force the outputs to drive and inputs to receive to find faults and determine a proper fusing recipe. In other embodiments, the fuse distribution done signal and delayed fuse distribution done signal are distributed through TSVs to the other die in the stack after being written to the bottom die.

Figure 3D:
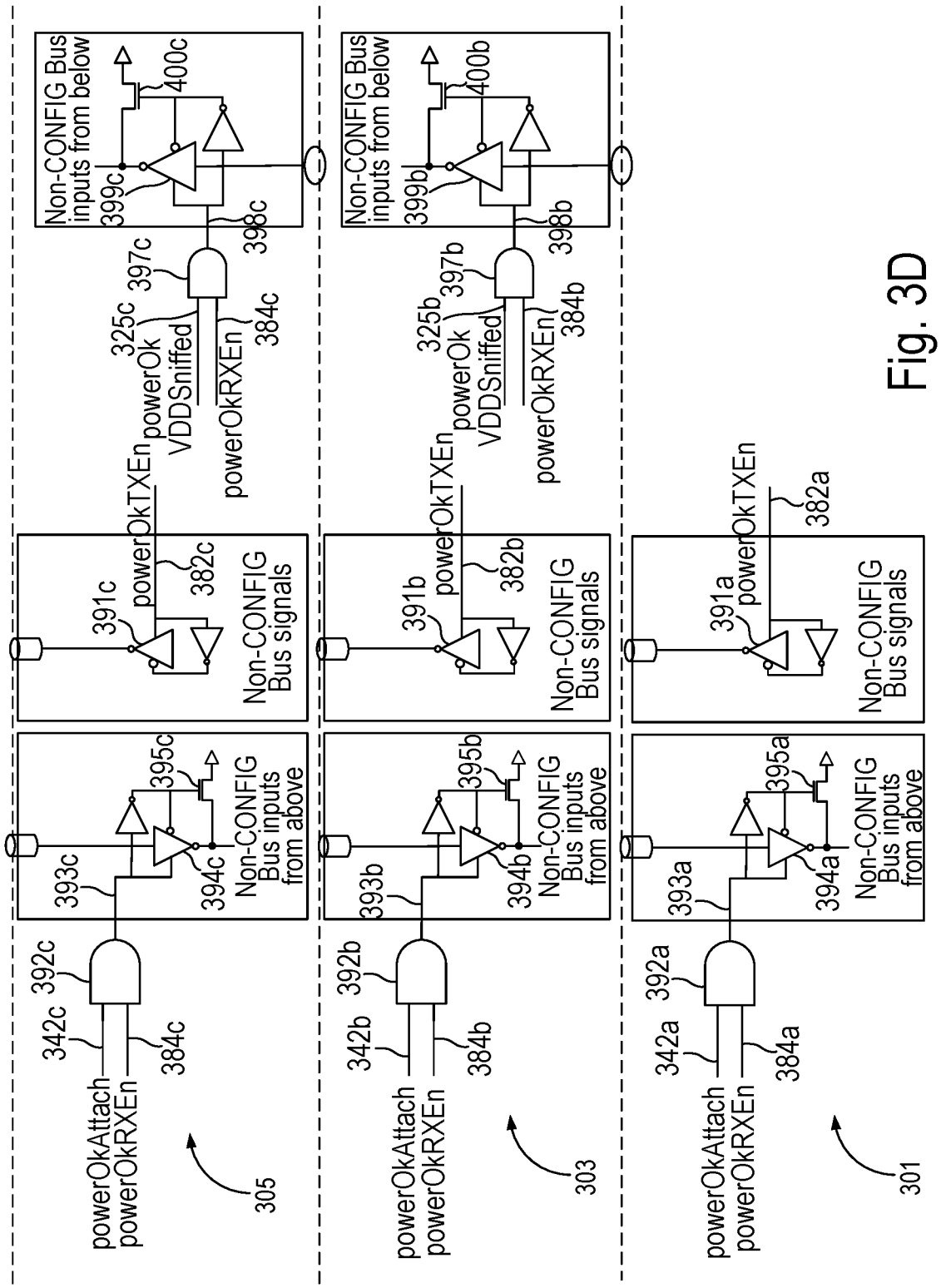
FIG. 3D illustrates additional details of another embodiment of a three die stacked system and in particular driving and deisolating non-configuration bus signals after fuse distribution is complete.

Referring to FIG. 3D, the transmit circuits on the top die, represented by transmit circuit 391c, receive the powerOkTXEn signal 382c and when asserted causes the top die 305 to transmit its non-configuration (Non-CONFIG) bus signals. The transmit circuits on the middle die, represented by transmit circuit 391b, receive the powerOkTXEn signal 382b and when asserted causes the middle die 303 to transmit its non-configuration bus signals. The transmit circuits on the bottom die, represented by transmit circuit 391a, receive the powerOkTXEn signal 382a and when asserted causes the bottom die 301 to transmit its non-configuration bus signals.

In addition, AND gate 392c receives the receive enable signal (powerOkRXEn) 384c and powerOkAttach (same as in FIG. 1B) 342c and supplies a deisolation signal 393c to receive circuits on the top die, represented by receive circuit 394c. However, because the powerOKAttach signal 342c is not asserted on the top die 303, the inputs from above remain isolated by turning off receive circuit 394c and turning on transistor 395c to maintain a known value on the output of the receive circuit. For the middle die 303, AND gate 392b receives the receive enable signal (powerOkRXEn) 384b and powerOkAttach signal 342b and supplies a deisolation signal 393b to receive circuits on the middle die, represented by receive circuit 394b. The inputs from above are deisolated by turning on receive circuit 394b and turning off transistor 395b. For the bottom die 301, AND gate 392a receives the receive enable signal (powerOkRXEn) 384a and powerOkAttach signal 342a and supplies a deisolation signal 393a to receive circuits on the bottom die, represented by receive circuit 394a. The inputs from above are deisolated by turning on receive circuit 394a and turning off transistor 395a.

On the top die 305, AND gate 397c logically combines the receive enable signal powerOkRXEn 384c and powerOkVDDSniffed 325c to generate the deisolate signal 398c that, when asserted, enables receivers on the top die, represented by receiver 399c, to receive non-configuration bus signals received from below (from die 303). The deisolation signal 398c turns on receive circuit 399c and the inverted deisolation signal turns off transistor 400c.

On the middle die 303, AND gate 397b logically combines the receive enable signal powerOkRXEn 384b and powerOkVDDSniffed 325b to generate the deisolate signal 398b that, when asserted, enables receivers on the top die, represented by receiver 399b, to receive non-configuration bus signals received from below (from die 301). The deisolation signal 398b turns on receive circuit 399b and the inverted deisolation signal turns off transistor 400b.

Figure 4:
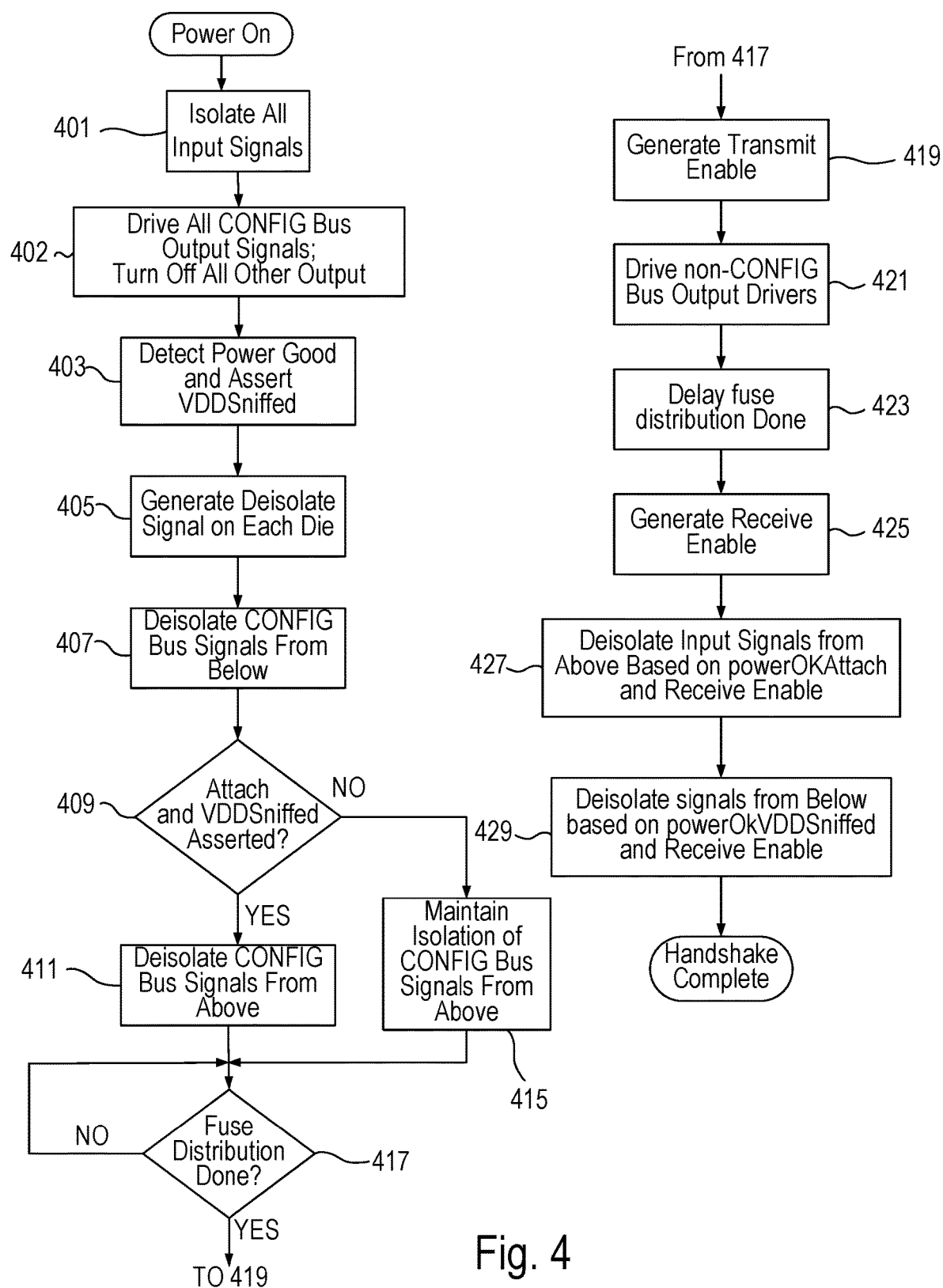
FIG. 4 illustrates a flow diagram of operation of the embodiment illustrated in FIGS. 3A-3D.

FIG. 4 illustrates operation of a die stack in accordance with the embodiments illustrated in FIGS. 3A-3D. FIG. 4 shows a flow chart illustrating the handshake that occurs in the stacked die embodiment using a configuration bus to distribute fuse information before enabling driver circuits and deisolating inputs. Right after power on occurs, in 401 the die isolate all input signals. In addition, all output drivers are turned off except for configuration bus signals in 402. Note that 401 and 402 occur together. At 403, each die detects if power is good and asserts a VDDSniffed signal. With usePadIO 309 pulled to ground, VDDSniffed is provided from the die below and combined with VDDSniffed on the particular die to generate a deisolate signal in 405. With the deisolate signal asserted, the particular die deisolates all configuration bus signals from below in 407. Note that on the first die 301 in the embodiment illustrated in FIGS. 3A-3D, no signals are provided from die below and the handshake and circuits to enable signals from below are not needed. Each die also evaluates the Attach signal in 409. If Attach and VDDSniffed are both asserted on a particular die, the die deisolates all configuration bus signals from above in 411. For die 305, Attach is not asserted and remains at ground (NO path from 409), the isolation of signals from above is maintained in 411. In that way, the die stack can be of arbitrary height and the top die still maintains the isolation of configuration bus inputs from above.

Once the configuration bus inputs from above and below are deisolated, the configuration bus can be used to distribute fuse information to repair any shorted TSVs. The die wait in 417 for the fuse distribution to be completed. The fuse distribution being done indicates that any needed repairs have been completed and responsive to the fuse distribution being done, the die generate a transmit enable signal (powerOkTXEn) 421 and based on the transmit enable signal, turn on their non-configuration bus output drivers to start driving non-configuration bus signals in 421. After a delay in 423, the fuse distribution delay signal asserts, causing the die to generate the receive enable signal (powerOkTXEn). Responsive to the receive enable signal, the die deisolate their signals from above based on powerOkAttach indicating a die is above with good power and the receive enable signal in 427. Of course, the top die in the stack does not deisolate inputs from above. In 429 the die deisolate their input signals from below based on powerOkVDDSniffed and the receive enable signal. Note that while the actions in the flow diagram of FIG. 4 are shown to be sequential, some of the actions occur simultaneously. For example, in embodiments input signals are isolated and drivers turn off after power up substantially simultaneously. Further, in embodiments the deisolating handshake for inputs from above and below occur simultaneously.

Thus, the embodiment illustrated in FIGS. 3A-3D and 4 includes the ability to turn off most drivers, with the exception of configuration bus drivers, until the TSVs are known to not need repair or have been repaired, thereby reducing the risk of a high current draw due to a shorted TSV. After the inputs are driven, the die deisolate their inputs from above and below based on the presence of die with good power in the die stack. Note that the various receive circuits shown in the embodiment illustrated in FIGS. 3A, 3B, and 3D are tristate inverters. The tristate inverters allow the outputs of the receive circuits to be placed in high impedance and pulled to a known voltage to provide appropriate isolation.

Thus, embodiments have been described that utilize a handshake in a stacked die or other environment. In other embodiments the handshake mechanisms is utilized in environments in which the die are not stacked. The description of the invention set forth herein is illustrative, and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An apparatus comprising:
   a first die having first inputs coupled to respective receive circuits to receive first configuration bus signals from below;
   a second die supplying the first configuration bus signals to the first inputs, the first die and the second die being formed in a die stack;
   wherein the first die is configured to drive at least one configuration bus signal to the second die and the first die is configured to disable driving of first additional signals from the first die to the second die responsive to a first additional signals drive signal being unasserted;
   a first fuse distribution complete storage location on the first die to store a fuse distribution complete indication indicating that needed repairs on through silicon vias based on fused information are complete;
   a delayed fuse distribution complete storage location on the first die to store a delayed fuse distribution complete indication that is a delayed version of the fuse distribution complete indication;
   a first override storage location in the first die to store a first override signal used to override a value of the fuse distribution complete indication;
   a second override storage location on the first die to supply a second override signal used to override a value of the delayed fuse distribution complete indication;
   a first logic circuit to logically combine the delayed fuse distribution complete indication, the second override signal, and a first die power detect signal generated on the first die, and to supply a receiver enable signal to additional receive circuits on the first die receiving second additional signals from the second die, the receiver enable signal being asserted responsive to the first die power detect signal being asserted in combination with the delayed fuse distribution complete indication being asserted; and
   a second logic circuit on the first die to logically combine the fuse distribution complete indication, the first override signal, and the first die power detect signal and to supply the first additional signals drive signal, the first additional signals drive signal being asserted responsive to the fuse distribution complete indication being asserted in combination with the first die power detect signal being asserted.

2. The apparatus as recited in claim 1 further comprising:
   a third logic circuit on the first die to logically combine a second die power detect signal and the first die power detect signal to generate a first die deisolation signal to cause the first inputs to be deisolated on the first die.

3. The apparatus as recited in claim 1 further comprising:
   a first plurality of through silicon vias coupling the first die and the second die and coupled to supply the first configuration bus signals to the first inputs on the first die.

4. The apparatus as recited in claim 1,
   wherein the receiver enable signal is also asserted responsive to the second override signal being asserted in combination with the first die power detect signal being asserted; and
   wherein the first additional signals drive signal is also asserted responsive to the first override signal being asserted in combination with the first die power detect signal being asserted.

5. The apparatus as recited in claim 1
   wherein the second die is configured to enable driving of the second additional signals from the second die to the first die responsive to, at least in part, a second fuse distribution complete indication on the second die indicating that needed repairs on through silicon vias based on fused information are complete.

6. The apparatus as recited in claim 5,
   wherein the second die is configured to deisolate second inputs responsive to, in part, assertion of a delayed second fuse distribution complete indication that is delayed from the second fuse distribution complete indication, the second inputs coupled to receive the first additional signals from the first die.

7. The apparatus as recited in claim 6, wherein the first die further comprises:
   third inputs to receive input signals from above; and
   wherein the first die is responsive to deisolate the third inputs responsive to, at least in part, a third die power detect signal received by the first die indicating that power is good on a third die, the third inputs coupled to receive third input signals supplied by the third die.

8. An apparatus comprising:

a plurality of stacked die supplying respective attach signals to respective die below, the respective attach signals indicating that power is good on the respective die when asserted;

wherein a bottom die of the stacked die deisolates a first input receiving a first signal from a second die above the bottom die responsive to, at least in part, a first of the attach signals supplied to the bottom die from the second die indicating that power is good on the second die;

wherein a top die of the stacked die maintains a second input from above isolated responsive to not receiving an asserted second of the attach signals from above due to lack of another die above the top die driving the second of the attach signals; and wherein the second die of the stacked die deisolates a third input receiving a second signal from above responsive to a third of the attach signals indicating that power is good on another die above the second die.

9. The apparatus as recited in claim 8 wherein the second die further comprises:

a probe pad coupled to a node in the second die;

logic coupled to the node in the second die, the logic being configured to isolate inputs from the bottom die responsive to a signal of a first voltage value being applied to the probe pad;

a resistor coupled between the node and ground; and wherein the resistor pulls the node to ground when the probe pad is left floating to thereby allow a bottom die signal indicative of power being good on the bottom die to be used in determining whether to deisolate the inputs from the bottom die.

10. The apparatus as recited in claim 8 wherein the top die further comprises:

a landing pad to receive the second of the attach signals from above; and a resistor coupled between an internal node in the top die and the landing pad, the internal node being pulled to ground through the resistor responsive to the second of the attach signals from above not being driven due to lack of another die above the top die, the internal node being pulled to ground to thereby maintain the second input from above isolated.

11. The apparatus as recited in claim 8, wherein the second die deisolates fourth inputs receiving third signals from the bottom die responsive to a first power good indication from the bottom die and the second die drives the first signal responsive to a power up condition;

wherein the bottom die is configured to drive the third signals responsive to the power up condition while disabling driving of fourth signals from the bottom die to the second die;

wherein the bottom die is configured to enable driving the fourth signals responsive to, at least in part, a first fuse distribution complete indication on the bottom die indicating that through silicon vias have been repaired using fuse information or are not in need of repair; and wherein the bottom die further comprises fifth inputs coupled to receive fifth signals from the second die, and wherein the bottom die is configured to deisolate the fifth inputs responsive to, at least in part, a delayed first fuse distribution complete indication on the bottom die that is asserted after a delay from assertion of the first fuse distribution complete indication, the delay ensuring that the fifth inputs are not deisolated until after the fifth signals are driven by the second die.

12. An apparatus comprising:

a plurality of die in a die stack including a bottom die, a second die disposed immediately above the bottom die, and a third die above the second die;

wherein the bottom die includes a first receiver circuit receiving a first signal from the second die on a first input, the first receiver circuit being enabled to deisolate the first input responsive to, at least in part, a second die signal received from the second die that is generated using a second die power good indication generated on the second die on power up;

wherein the second die includes second receiver circuits receiving second signals from the bottom die on second inputs, the second receiver circuits being enabled to deisolate the second inputs responsive to, at least in part, a bottom die signal received from the bottom die that is generated using a bottom die power good indication generated on the bottom die on power up;

wherein the bottom die is configured to drive the second signals responsive to power up while disabling driving of first additional signals from the bottom die to the second die;

wherein the bottom die is configured to enable driving of the first additional signals from the bottom die to the second die responsive to, at least in part, a first fuse distribution complete indication on the bottom die indicating that through silicon vias have been repaired using fuse information or are not in need of repair; and wherein the third die maintains at least one third die input from above isolated absent an indication that another die above the third die has powered up, the indication being absent thereby indicating the third die is a topmost die.

13. The apparatus as recited in claim 12 wherein the second die further comprises:

a probe pad; and logic coupled to the probe pad and to the second receiver circuits to disable the second receiver circuits regardless of a value of the bottom die signal responsive to a signal of a first value being applied to the probe pad.

14. The apparatus as recited in claim 12, wherein the second die is configured to drive the first signal while disabling driving of second additional signals from the second die to the bottom die; and wherein the second die is configured to enable driving of the second additional signals from the second die to the bottom die responsive to, at least in part, a second fuse distribution complete indication on the second die.

15. The apparatus as recited in claim 14, wherein the bottom die further comprises third inputs coupled to receive the second additional signals from the second die, and wherein the bottom die is configured to deisolate the third inputs responsive to a delayed first fuse distribution complete indication on the bottom die that is asserted after a first delay from assertion of the first fuse distribution complete indication, the first delay ensuring that the third inputs are not deisolated until after the second additional signals are driven; and wherein the second die comprises fourth inputs coupled to receive the first additional signals from the bottom die, and wherein the second die is configured to deisolate the fourth inputs responsive to a delayed second fuse distribution complete indication on the second die that is asserted after a second delay from assertion of the second fuse distribution complete indication, the second delay ensuring that the fourth inputs are not deisolated until after the first additional signals are driven.

16. The apparatus as recited in claim 15,
wherein the second die comprises a first override storage location supplying a first override signal used to override a value of the second fuse distribution complete indication to thereby enable transmitters on the second die regardless of a value of the second fuse distribution complete indication; and
wherein the second die comprises a second override storage location supplying a second override signal used to override a value of the delayed second fuse distribution complete indication to thereby enable receivers on the second die regardless of a value of the second delayed fuse distribution complete indication.

17. The apparatus as recited in claim 15 wherein the first signal and the second signals are configuration bus signals used to transport fuse information to repair the through silicon vias.

18. The apparatus as recited in claim 17 wherein the fuse information is stored in the bottom die.

19. The apparatus as recited in claim 12,
wherein the topmost die supplies a top die signal that is generated using a top die power good indication generated on the topmost die at power up to a fourth die that is immediately under the topmost die in the die stack; and
wherein the fourth die uses the top die signal to generate a fourth die deisolate signal to deisolate a fourth die input receiving a fourth signal being driven by the top die.

20. The apparatus as recited in claim 12,
wherein the bottom die includes a first power detect circuit to generate the bottom die power good indication;
wherein the second die includes a second power detect circuit to generate the second die power good indication; and
wherein the third die includes a third power detect circuit to generate a third die power good indication.

* * * * *